(12) United States Patent
Bunnell et al.

(10) Patent No.: US 10,383,266 B2
(45) Date of Patent: Aug. 13, 2019

(54) WIRELESS SIGNAL ISOLATION ASSEMBLY

(71) Applicant: Audio Precision, Inc., Beaverton, OR (US)

(72) Inventors: William Bunnell, Beaverton, OR (US); Fredrick Capell, Jr., Beaverton, OR (US); William Noelcke, Beaverton, OR (US)

(73) Assignee: Audio Precision, Inc., Beaverton, OR (US)

( * ) Notice: Subject to any disclaimer, the term of this patent is extended or adjusted under 35 U.S.C. 154(b) by 0 days.

(21) Appl. No.: 16/141,898

(22) Filed: Sep. 25, 2018

(65) Prior Publication Data
US 2019/0098803 A1    Mar. 28, 2019

Related U.S. Application Data

(60) Provisional application No. 62/562,984, filed on Sep. 25, 2017.

(51) Int. Cl.
*H05K 9/00* (2006.01)
*H05K 1/02* (2006.01)

(52) U.S. Cl.
CPC ......... *H05K 9/0032* (2013.01); *H05K 1/0216* (2013.01)

(58) Field of Classification Search
CPC ................................................. H05K 9/0032
See application file for complete search history.

(56) References Cited

U.S. PATENT DOCUMENTS

| 8,379,408 B2 * | 2/2013 | Hankui | H05K 9/0032 361/818 |
| 2014/0038437 A1 * | 2/2014 | Liao | H01R 13/62 439/73 |

* cited by examiner

*Primary Examiner* — Hung V Ngo
(74) *Attorney, Agent, or Firm* — McCoy Russell LLP

(57) ABSTRACT

Apparatuses, systems and methods associated isolation to avoid interference from wireless signals in a circuit assembly are disclosed herein. In embodiments, a wireless signal isolation assembly may include an outer shield enclosure, the outer shield enclosure to enclose circuitry of a circuit board that is to be isolated from interference, wherein the outer shield enclosure is to attenuate wireless signals. The wireless signal isolation assembly may further include a first inner shield enclosure located within the outer shield enclosure, the first inner shield enclosure to enclose first circuitry, wherein the first inner shield enclosure is to attenuate wireless signals. The wireless signal isolation assembly may further include a second inner shield enclosure located within the outer shield enclosure, the second inner shield enclosure to enclose second circuitry, wherein the second inner shield enclosure is to attenuate wireless signals. Other embodiments may be described and/or claimed.

19 Claims, 10 Drawing Sheets

WIRELESS SIGNAL ISOLATION ASSEMBLY

RELATED APPLICATIONS

The present application claims priority to U.S. Provisional Patent Application No. 62/562,984, filed Sep. 25, 2017, entitled "WIRELESS SIGNAL ISOLATION ASSEMBLY", the entire disclosure of which is hereby incorporated by reference.

TECHNICAL FIELD

The present disclosure relates to the field of wireless signal isolation. More particularly, the present disclosure relates to isolation to avoid interference from wireless signals in a circuit assembly.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

In environments where multiple devices having wireless communication capabilities are being utilized, there may be a high probability of interference from the wireless signals transmitted by the devices. For example, in mass equipment testing environments, the high probability of interference from wireless signals may cause the amount of equipment that may be tested at one time to be limited, which is inefficient and often unrealistic to achieve desired production rates. Further, in devices having multiple signals propagating within the single device, there may exist a high probability of interference among the signals, which may negatively affect one or more of the signals within the device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
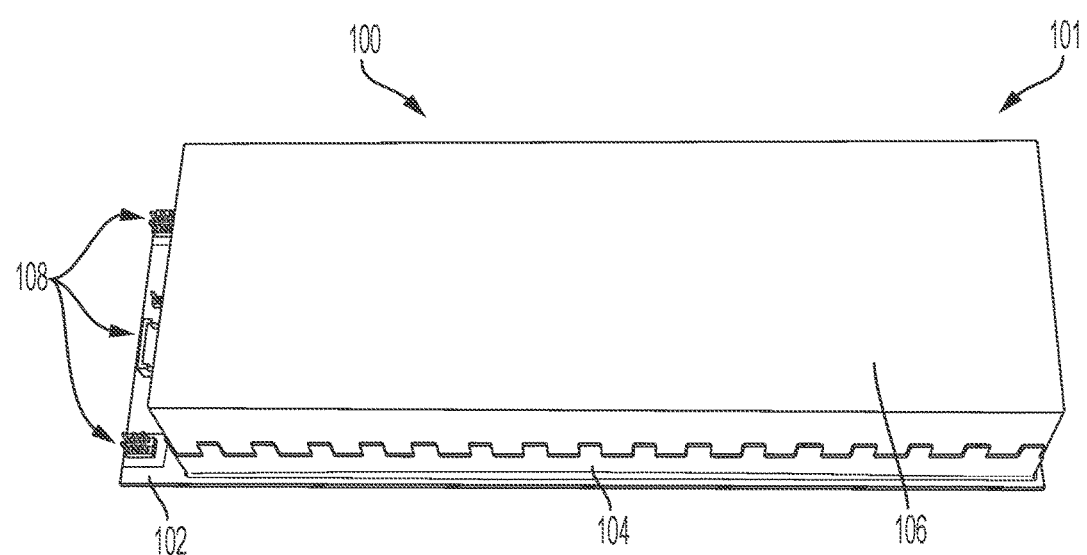
FIG. 1 illustrates an example wireless signal isolation assembly, according to various embodiments.

Apparatuses, systems and methods associated with isolation assemblies to avoid interference from wireless signals in a circuit assembly are disclosed herein. In embodiments, a wireless signal isolation assembly may include an outer shield enclosure, the outer shield enclosure to enclose circuitry of a circuit board that is to be isolated from interference, wherein the outer shield enclosure is to attenuate wireless signals. The wireless signal isolation assembly may further include a first inner shield enclosure located within the outer shield enclosure, the first inner shield enclosure to enclose first circuitry, wherein the first inner shield enclosure is to attenuate wireless signals. The wireless signal isolation assembly may further include a second inner shield enclosure located within the outer shield enclosure, the second inner shield enclosure to enclose second circuitry, wherein the second inner shield enclosure is to attenuate wireless signals.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that executes one or more software or firmware programs, a combinational logic circuit, and/or other suitable components that provide the described functionality.

FIG. 1 illustrates an example wireless signal isolation assembly 100, according to various embodiments. The wireless signal isolation assembly 100 may include an outer shield enclosure 101. The outer shield enclosure 101 may be mounted to a circuit board 102. In particular, the outer shield enclosure 101 may include extensions that may be soldered to the circuit board 102, may be affixed to the circuit board 102 via epoxy, may be affixed to the circuit board 102 via one or more fasteners, or some combination thereof. The wireless signal isolation assembly 100 and the circuit board 102 may be collectively referred to as "a wireless signal isolation device." It is to be understood that the wireless signal isolation device may be implemented within a computer device, test equipment, and/or other electrical devices.

The outer shield enclosure 101 may include an outer fence 104 and an outer cover 106. The outer fence 104 may be mounted to the circuit board 102, with a perimeter of the outer fence 104 encircling circuitry of the circuit board 102 that is to be isolated from external wireless interference (as described further in relation to FIG. 2). Portions of the circuit board 102 may extend outside of the outer fence 104, such as connectors 108, which may be utilized to couple the circuit board 102 to external electrical components, external circuitry, external devices, or some combination thereof.

The outer fence 104 may be formed of a material that attenuates wireless signals (such as radio frequency (RF) signals, wireless fidelity (Wi-Fi) signals, mobile communication signals, Bluetooth signals, or some combination thereof) as the signals pass, or attempt to pass, through the material. In particular, the outer fence 104 may be formed of tin-plated steel in some embodiments. In other embodiments, the outer fence 104 may be formed of copper, nickel, silver, tin, steel, aluminum, zinc, alloys thereof, or some combination thereof. The outer fence 104 may attenuate the wireless signals by up to 30 decibels (dB). In some embodiments, the outer fence 104 may attenuate the wireless signals by between 20 dB and 30 dB.

The outer cover 106 may couple to the top portion of the outer fence 104 and may maintain the position of the outer cover 106 relative to the outer fence 104 when coupled. The outer cover 106 may be coupled to the outer fence 104 by friction generated between the outer fence 104 and the outer cover 106 when the outer cover 106 is positioned on the outer fence 104 (as is described further in relation to FIG. 2). In other embodiments, the outer cover 106 may be coupled to the outer fence 104 via friction, epoxy, fasteners, or some combination thereof.

The outer cover 106 may be formed of a material that attenuates wireless signals as the signals pass, or attempt to pass, through the material. In particular, the outer cover 106 may be formed of tin-plated steel in some embodiments. In other embodiments, the outer cover 106 may be formed of copper, nickel, silver, tin, steel, aluminum, zinc, alloys thereof, or some combination thereof. The outer cover 106 may attenuate the wireless signals by up to 30 decibels (dB). In some embodiments, the outer cover 106 may attenuate the wireless signals by between 20 dB and 30 dB.

The outer cover 106 may cover an opening of the top portion of the outer fence 104, such that the outer cover 106 and the outer fence 104, along with the circuit board 102, enclose the circuitry of the circuit board 102 that is to be isolated.

The circuit board 102 may include a first layer and/or a first region formed of a material that attenuates wireless signals as the signals pass, or attempt to pass, through the material. The first layer and/or the first region may extend for an area of the circuit board 102 encircled by the outer fence 104 or for an entirety of a footprint of the circuit board 102. The first layer and/or the first region may be formed of copper in some embodiments. In other embodiments, the first layer and/or the first region may be formed of copper, nickel, silver, tin, steel, aluminum, zinc, alloys thereof, or some combination thereof. The first layer and/or the first region may attenuate the wireless signals by up to 30 decibels (dB). In some embodiments, the first layer and/or the first region may attenuate the wireless signals by between 20 dB and 30 dB. Based on the layer and/or the region, the outer fence 104, and the outer cover 106 enclosing the circuitry to be shielded from external wireless interference, wireless signals may be attenuated up to 30 decibels when entering or exiting the area enclosed by the layer and/or the region, the outer fence 104, and the outer cover 106 from any direction. In some embodiments, the circuit board 102 may include two or more layers and/or regions formed of the material that attenuates wireless signals rather than a single layer and/or region.

Figure 2:
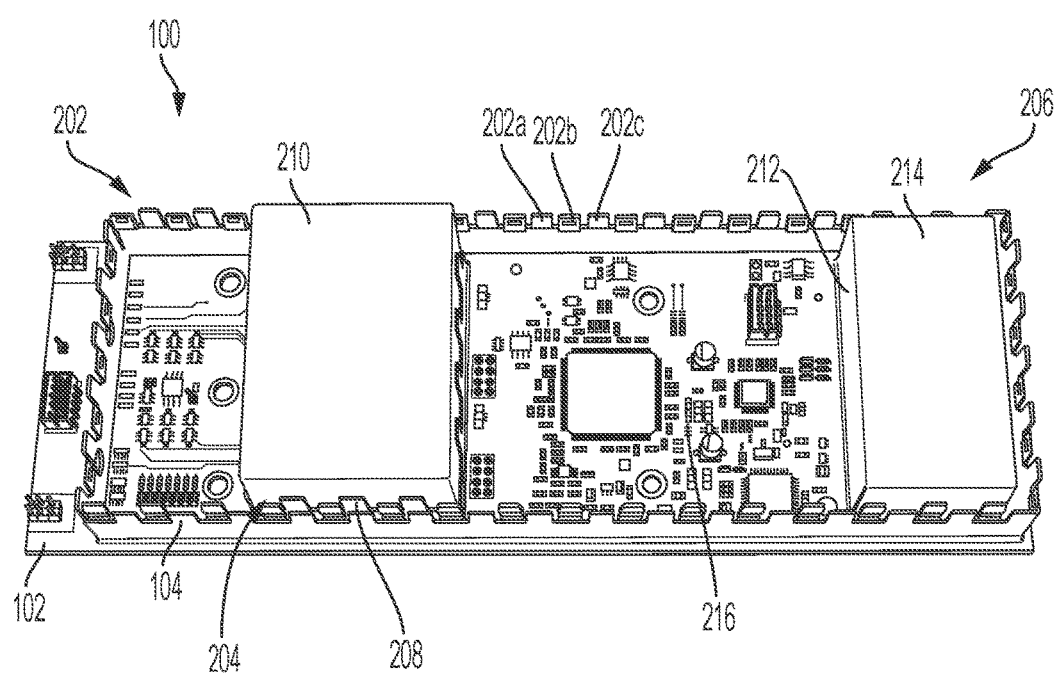
FIG. 2 illustrates the example wireless signal isolation assembly of FIG. 1 without the outer cover, according to various embodiments.

FIG. 2 illustrates the example wireless signal isolation assembly 100 of FIG. 1 without the outer cover 106 (FIG. 1), according to various embodiments. In particular, the outer cover 106 is decoupled from the outer fence 104 in FIG. 2. Accordingly, FIG. 2 illustrates circuitry and other features enclosed within the outer fence 104 and the outer cover 106, in accordance with some embodiments.

The outer fence 104 may include a series of offset extensions 202 formed along a top edge of the outer fence 104. The series of offset extensions 202 may extend around an entirety of the outer fence 104, or some portion thereof. For example, the series of offset extensions 202 may include a first offset extension 202a, a second offset extension 202b located adjacent to the first offset extension 202a, and a third offset extension 202c located adjacent to the second offset extension 202b and on an opposite side of the second offset extension 202b from the first offset extension 202a. The first offset extension 202a and the third offset extension 202c may extend along a plane of the outer fence 104, while the second offset extension 202b may be offset from the plane by a certain distance. In some embodiments, a portion of the second offset extension 202b may extend toward the plane.

When the outer cover 106 is coupled to the outer fence 104, an outer edge of the outer cover 106 may be located between the first offset extension 202a and the second offset extension 202b, and between the second offset extension 202b and the third offset extension 202c. The first offset extension 202a and the third offset extension 202c may contact a first side of the outer cover 106, and the second offset extension 202b may contact a second side of the outer cover 106, the second side opposite to the first side. When the outer cover 106 is coupled to the outer fence 104, the outer edge of the outer cover 106 may cause the first offset extension 202a, the second offset extension 202b, and/or the third offset extension 202c to be displaced from initial positions. When displaced, the first offset extension 202a, the second offset extension 202b, and/or the third offset extension 202c may be urged to return to the initial positions, which may cause the first offset extension 202a, the second offset extension 202b, and/or the third offset extension 202c to be pressed against the corresponding sides of the outer cover 106. The first offset extension 202a, the second offset extension 202b, and/or the third offset extension 202c being pressed against the outer cover 106 may generate friction between the first offset extension 202a, the second offset extension 202b, and/or the third offset extension 202c and the outer cover 106, which may couple the outer cover 106 to the outer fence 104 and maintain a position of the outer cover 106 relative to the outer fence 104. While features of the series of offset extensions 202 are described in relation to the first offset extension 202a, the second offset extension 202b, and the third offset extension 202c, it is to be understood that these features may be implemented by any of the offset extensions within the series of offset extensions 202. Further, in some embodiments, the outer cover 106 may be further coupled to the outer fence 104 via epoxy, glue, tape (such as copper tape with conductive adhesive), fasteners, or some combination thereof.

In some embodiments, the series of offset extensions 202 may be omitted. In these embodiments, the top edge of the outer fence 104 may have a continuous edge that extends for the top edge of the outer fence 104. Further, in these embodiments, the outer cover 106 may include a series of offset extensions that include one or more of the features of the offset extensions 202. In other of these embodiments, the outer cover 106 may be coupled to the outer fence 104 via friction, epoxy, fasteners, or some combination thereof.

The wireless signal isolation assembly 100 may further include a first inner shield enclosure 204 and a second inner shield enclosure 206. The first inner shield enclosure 204 may include a first inner fence 208 and a first inner cover 210. The first inner fence 208 may include one or more of the features of the outer fence 104. In particular, the first inner fence 208 may be mounted to the circuit board 102 by any of the means of mounting the outer fence 104 to the circuit board 102 and may be formed of any of the same materials as the outer fence 104, as described in relation to FIG. 1. In some embodiments, the first inner fence 208 may be formed of tin-plated steel.

The first inner fence 208 may have a perimeter that encircles first circuitry of the circuit board 102. The first circuitry may be particularly sensitive and/or susceptible to interference from wireless signals. In particular, the first circuitry may be sensitive and/or susceptible to wireless signals, such as a radio frequency (RF) signal, a wireless fidelity (Wi-Fi) signal, a mobile communication signal, a Bluetooth signal, or some combination thereof. In some embodiments, the first circuitry may be circuitry associated with a Bluetooth radio, the Bluetooth radio to send audio signals to the device under test for testing.

The circuit board 102 may include a second layer and/or a second region formed of a material that attenuates wireless signals as the signals pass, or attempt to pass, through the material. The second layer and/or the second region may extend for an area of the circuit board 102 encircled by the first inner fence 208 or for an entirety of a footprint of the circuit board 102. The second layer and/or the second region may be formed of copper. In other embodiments, the second layer and/or the second region may be formed of copper, nickel, silver, tin, steel, aluminum, zinc, alloys thereof, or some combination thereof. The second layer and/or the second region may attenuate the wireless signals by up to 30 decibels (dB).

The first inner cover 210 may include one or more of the features of the outer cover 106. In particular, the first inner cover 210 may be formed of a same material as the outer cover 106 and may couple to the first inner fence 208 by the same means as the outer cover 106 couples to the outer fence 104, as described in relation to FIG. 1 and FIG. 2. The first inner cover 210 may cover an opening of the top portion of the first inner fence 208, such that the first inner cover 210 and the first inner fence 208, along with the circuit board 102, enclose the circuitry of the circuit board 102 that is particularly sensitive and/or susceptible to interference from wireless signals. In particular, the second layer and/or the second region of the circuit board 102 may extend for an area of the circuit board 102 encircled by the first inner fence 208.

Based on the first inner cover 210, the first inner fence 208, and the second layer and/or the second region of the circuit board 102 enclosing the first circuitry, wireless signals may be attenuated up to 30 dB when entering or exiting the area enclosed by the second layer and/or the second region, the first inner fence 208, and the first inner cover 210 from any direction. In some embodiments, the wireless signals may be attenuated between 20 dB and 30 dB. Further, the attenuation provided by the first inner cover 210 and the first inner fence 208 may be in addition to the attenuation provided by the outer fence 104 and the outer cover 106, such that any external signals that enter the area enclosed by the first inner shield enclosure 204 may be attenuated twice.

The second shield enclosure 206 may include a second inner fence 212 and a second inner cover 214. The second inner fence 212 may include one or more of the features of the outer fence 104. In particular, the second inner fence 212 may be mounted to the circuit board 102 by any of the means of mounting the outer fence 104 to the circuit board 102 and may be formed of any of the same materials as the outer fence 104, as described in relation to FIG. 1. In some embodiments, the second inner fence 212 may be formed of a nickel-silver-copper alloy.

The second inner fence 212 may have a perimeter that encircles second circuitry of the circuit board 102 that is particularly sensitive and/or susceptible to interference from wireless signals. In particular, the second circuitry may be sensitive and/or susceptible to interference from wireless signals, such as a radio frequency (RF) signal, a wireless fidelity (Wi-Fi) signal, a mobile communication signal, a Bluetooth signal, or some combination thereof. In some embodiments, the second circuitry may be circuitry associated with connected circuitry. The connected circuitry may include long traces that may be sensitive and/or susceptible to interference from wireless signals.

The second inner cover 214 may include one or more of the features of the outer cover 106. In particular, the second inner cover 214 may couple to the second inner fence 212 by the same means as the outer cover 106 couples to the outer fence 104, as described in relation to FIG. 1 and FIG. 2. Further, the second inner cover 214 may be formed of a same material as the second inner fence 212. The second inner cover 214 may cover an opening of the top portion of the second inner fence 212, such that the second inner cover 214 and the second inner fence 212, along with the circuit board 102, enclose the circuitry of the circuit board 102 that is sensitive and/or susceptible to interference from wireless signals. In particular, the second layer and/or the second region of the circuit board 102 may extend for an area of the circuit board 102 encircled by the second inner fence 212.

Based on the second inner cover 214, the second inner fence 212, and the second layer and/or the second region of the circuit board 102 enclosing the circuitry, wireless signals may be attenuated up to 30 dB when entering or exiting the area enclosed by the second layer and/or the second region, the second inner fence 212, and the second inner cover 214 from any direction. In some embodiments, the wireless signals may be attenuated between 20 dB and 30 dB. The attenuation provided by the second inner cover 214 and the second inner fence 212 may be in addition to the attenuation provided by the outer fence 104 and the outer cover 106, such that any external signals that enter the area enclosed by the second inner shield enclosure 206 may be attenuated twice.

The circuit board 102 may include circuitry 216 located within the outer shield enclosure 101 (FIG. 1), and outside of the first inner shield enclosure 204 and the second inner shield enclosure 206. The circuitry 216 may propagate, control propagation of, and/or perform operations on the signals transmitted among the circuitry enclosed by the first inner shield enclosure 204, circuitry enclosed by the second inner shield enclosure 206, and components and/or devices located outside of the outer shield enclosure 101. Further, the circuitry 216 may store, generate, and/or perform operations on data, including data received from circuitry within the first inner shield enclosure 204, data received from circuitry within the second inner shield enclosure 204, data received from circuitry and/or devices external to the circuit board 102, or some combination thereof. The circuitry 216 may include signal filters (such as RF signal filters) that may attenuate certain signal frequencies. In some embodiments, the signal filters may include low-pass filters tuned to attenuate signal frequencies of greater than 100 megahertz. Further, in some embodiments, the signal filters may include band-stop filters to attenuate signal frequencies around 2.4 gigahertz, band-pass filters to pass signal frequencies within a band that is less than 100 megahertz, or some combination thereof.

Figure 3:
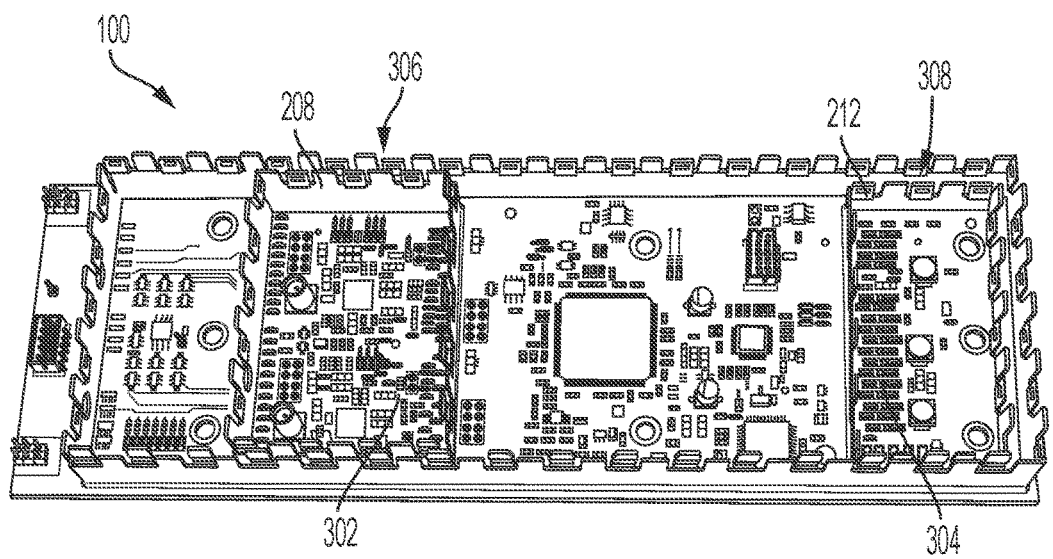
FIG. 3 illustrates the example wireless signal isolation assembly of FIG. 1 without the inner covers, according to various embodiments.

FIG. 3 illustrates the example wireless signal isolation assembly 100 of FIG. 1 without the inner covers, according to various embodiments. In particular, the first inner cover 210 (FIG. 2) is decoupled from the first inner fence 208 and the second inner cover 214 (FIG. 2) is decoupled from the second inner fence 212 in FIG. 3. Accordingly, FIG. 3 illustrates circuitry and other features enclosed within the first inner cover 210 and the first inner fence 208, and within the second inner cover 214 and the second inner fence 212, in accordance with some embodiments.

In particular, FIG. 3 illustrates first circuitry 302, which may be circuitry associated with a Bluetooth radio, as described as first circuitry enclosed by the first inner fence 208 and the first inner cover 210 in relation to FIG. 2. Further, FIG. 3 illustrates second circuitry 304, which may be circuitry associated with a backplane interface connector, as described as second circuitry enclosed by the second inner fence 212 and the second inner cover 214 in relation to FIG. 2.

The first inner fence 208 may include a series of offset extensions 306. The series of offset extensions 306 may include one or more of the features of the series of offset extensions 202 (FIG. 2) of the outer fence 104 (FIG. 1). The series of offset extensions 306 may provide for coupling between the first inner fence 208 and the first inner cover 210. In particular, the series of offset extensions 306 may provide for coupling between the first inner fence 208 and the first inner cover 210 in a same manner as the series of offset extensions 202 provide for coupling between the outer fence 104 and the outer cover 106 (FIG. 1) described in relation to FIG. 2.

In some embodiments, the series of offset extensions 306 may be omitted. In these embodiments, the top edge of the first inner fence 208 may have a continuous edge that extends for the top edge of the first inner fence 208. Further, in these embodiments, the first inner cover 210 may include a series of offset extensions that include one or more of the features of the offset extensions 306. In other of these embodiments, the first inner cover 210 may be coupled to the first inner fence 208 via friction, epoxy, fasteners, or some combination thereof.

The second inner fence 212 may include a series of offset extensions 308. The series of offset extensions 308 may include one or more of the features of the series of offset extensions 202 of the outer fence 104. The series of offset extensions 308 may provide for coupling between the second inner fence 212 and the second inner cover 214. In particular, the series of offset extensions 308 may provide for coupling between the second inner fence 212 and the second inner cover 214 in a same manner as the series of offset extensions 202 provide for coupling between the outer fence 104 and the outer cover 106 described in relation to FIG. 2.

In some embodiments, the series of offset extensions 308 may be omitted. In these embodiments, the top edge of the second inner fence 212 may have a continuous edge that extends for the top edge of the second inner fence 212. Further, in these embodiments, the second inner cover 214 may include a series of offset extensions that include one or more of the features of the offset extensions 308. In other of these embodiments, the second inner cover 214 may be coupled to the second inner fence 212 via friction, epoxy, fasteners, or some combination thereof.

Figure 4:
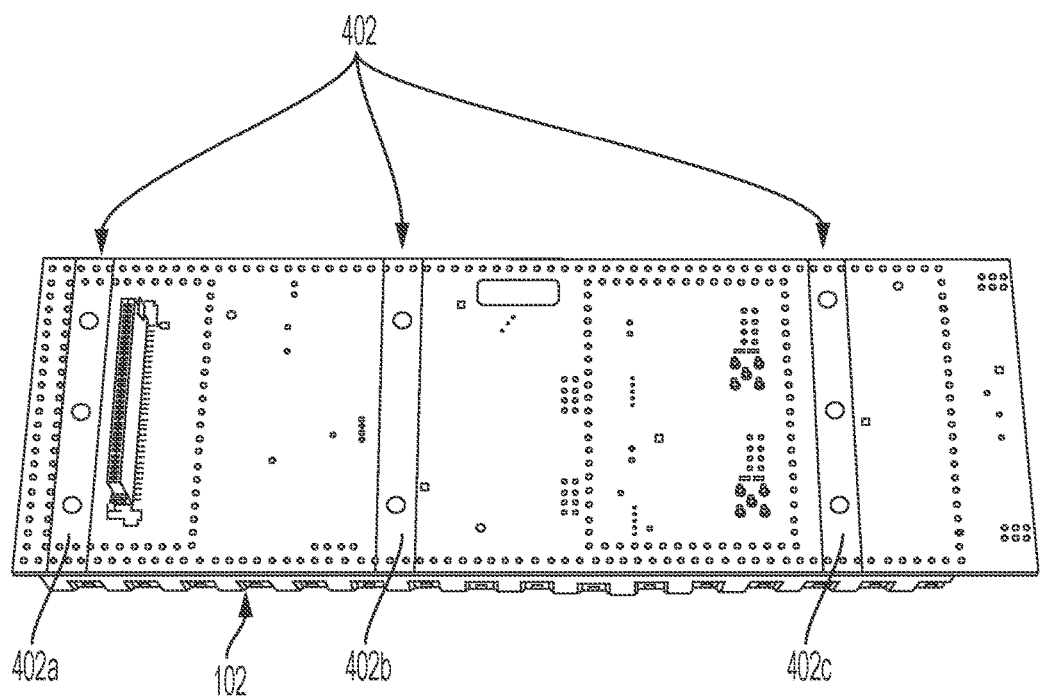
FIG. 4 illustrates a back of the circuit board of FIG. 1, according to various embodiments.

FIG. 4 illustrates a back of the circuit board 102 of FIG. 1, according to various embodiments. The back of the circuit board 102 may include one or more grounding strips 402. In particular, the illustrated embodiment includes a first grounding strip 402a, a second grounding strip 402b, and a third grounding strip 402c.

The grounding strips 402 may be utilized to ground the wireless signal isolation device to a ground of a device and/or chassis in which the wireless signal isolation device is implemented. In particular, the first layer and/or the first region of the circuit board 102 (described in relation to FIG. 1) and/or the outer shield enclosure 101 (FIG. 1) may be coupled to the grounding strips 402, and may be grounded to the ground of the device and/or chassis via the grounding strips 402. The grounding strips 402 may be grounded to the ground of the device and/or chassis via grounding blocks (see grounding blocks 502 of FIG. 5) as described further throughout this disclosure.

Figure 5:
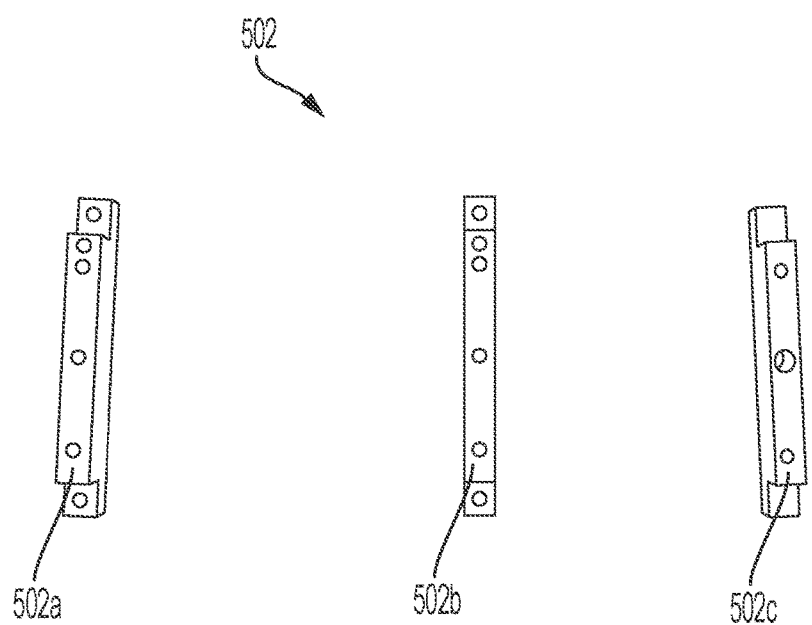
FIG. 5 illustrates example grounding blocks for the wireless signal isolation assembly of FIG. 1, according to various embodiments.

FIG. 5 illustrates example grounding blocks 502 for the wireless signal isolation assembly 100 of FIG. 1, according to various embodiments. The grounding blocks 502 may couple to the grounding strips 402 (FIG. 4) and to a ground of a device and/or chassis in which the wireless signal isolation assembly 100 is implemented (as described further in relation to FIG. 6). The grounding blocks 502 may be formed of a conductive material and may ground the grounding strips 402 to the ground of the device and/or chassis.

One or more grounding blocks 502 may be utilized to ground the grounding strips 402 to the ground of the device and/or the chassis. The grounding blocks 502 may provide a low impedance path for grounding of the grounding strips 402. Each of the grounding blocks 502 may correspond to each of the grounding strips 402 for a one-to-one ratio of grounding blocks 502 to grounding strips 402. In particular, in the illustrated embodiment, the grounding blocks 502 include a first grounding block 502a, a second grounding block 502b, and a third grounding block 502c. The first grounding block 502a may correspond to the first grounding strip 402a (FIG. 4), the second grounding block 502b may correspond to the second grounding strip 402b (FIG. 4), and the third grounding block 502c may correspond to the third grounding strip 402c (FIG. 4). In other embodiments, there be may more or less than three grounding blocks 502 and corresponding grounding strips 402.

Figure 6:
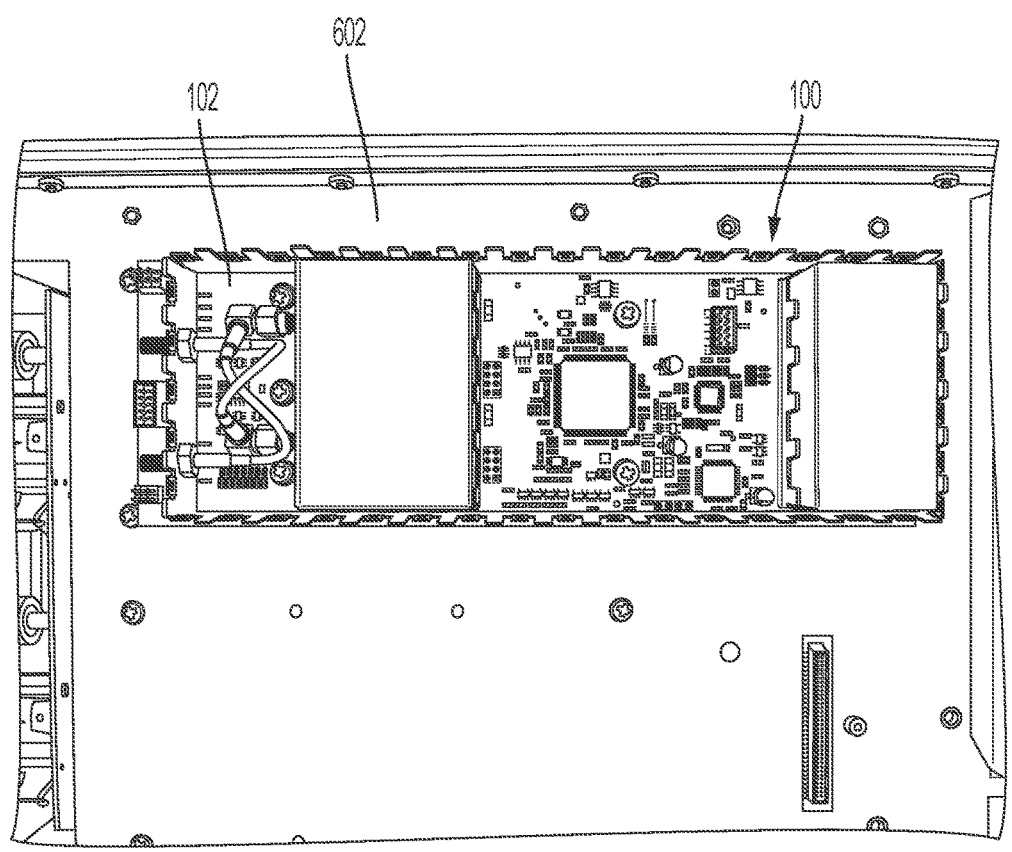
FIG. 6 illustrates the example wireless signal isolation assembly of FIG. 1 mounted within an example chassis, according to various embodiments.

FIG. 6 illustrates the example wireless signal isolation assembly 100 of FIG. 1 mounted within an example chassis 602, according to various embodiments. The chassis 602 may be a chassis for a computer device, a testing apparatus, and/or other electrical device. In particular, the wireless signal isolation device may be mounted to the chassis 602 via the grounding blocks 502 (FIG. 5). The grounding blocks 502 may be affixed to the chassis 602 via one or more fasteners, welds, solder, epoxy, or some combination thereof. Further, the circuit board 102 may be coupled to the grounding blocks 502 via one or more fasteners, welds, solder, epoxy, or some combination thereof.

The grounding blocks 502 may be grounded to the chassis 602 via affixture to the chassis 602. The grounding blocks 502 may be coupled to the grounding strips 402 (FIG. 4) of the circuit board 102, which may in turn ground the first layer and/or first region of the circuit board 102, the outer shield enclosure 101 (FIG. 1), to the chassis 602. Grounding the features to the chassis may facilitate attenuation of the wireless signals that pass through, or attempt to pass through, the first layer and/or first region of the circuit board 102, the outer shield enclosure 101 (FIG. 1), the first inner shield enclosure 204 (FIG. 2), the second inner shield enclosure 206 (FIG. 2), or some combination thereof.

Figure 7:
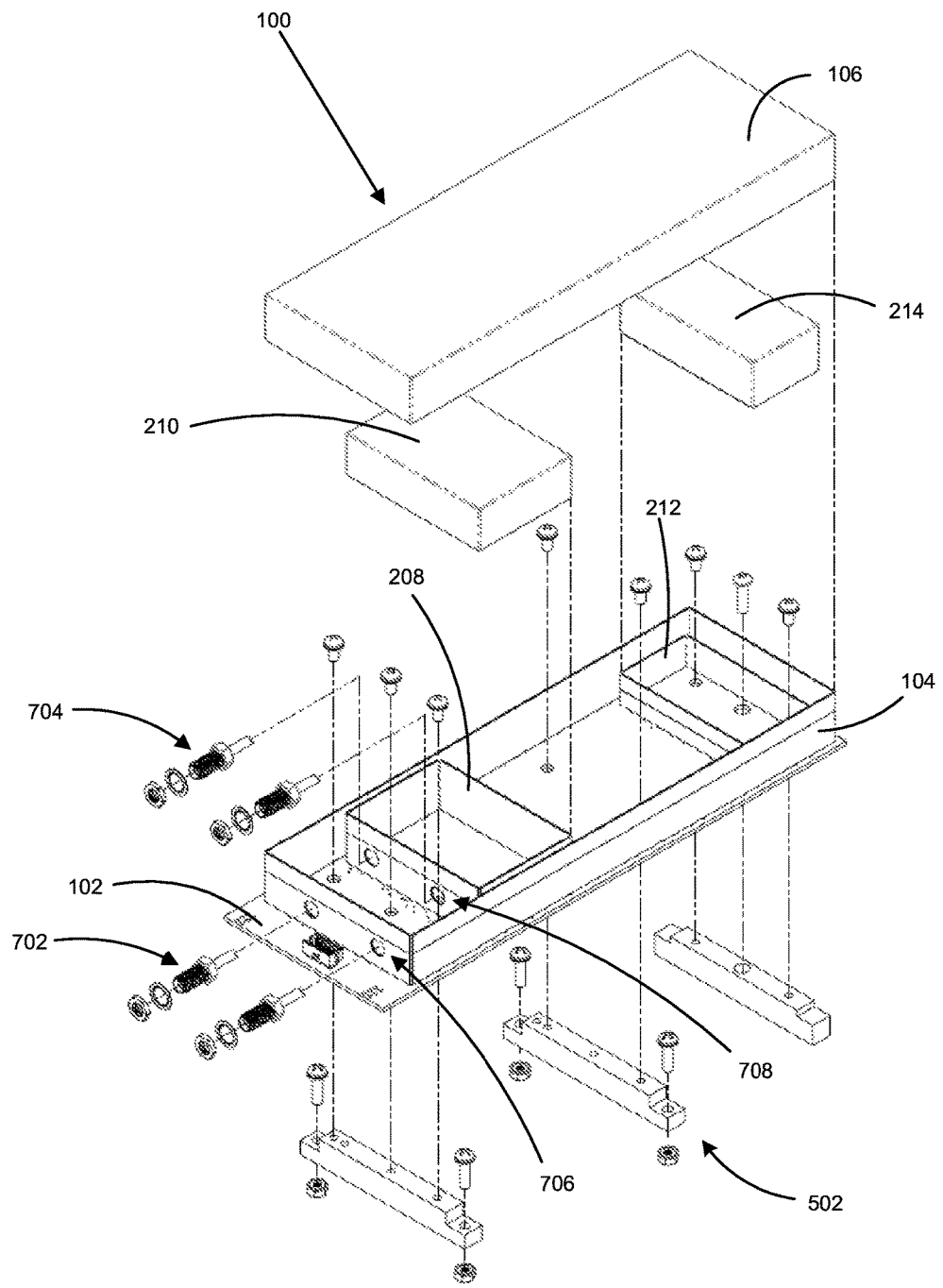
FIG. 7 illustrates an exploded assembly view of the example wireless signal isolation assembly of FIG. 1, according to various embodiments.

FIG. 7 illustrates an exploded assembly view of the example wireless signal isolation assembly 100 of FIG. 1, according to various embodiments. In particular, the exploded assembly view illustrates the outer fence 104, the first inner fence 208, and the second inner fence 212 mounted to the circuit board 102. Further, the outer cover 106, the first inner cover 210, and the second inner cover 214 are illustrated decoupled and above the corresponding outer fence 104, the first inner fence 208, and the second inner fence 212, respectively. The grounding blocks 502 are illustrated below the corresponding grounding strips 402 (FIG. 4) of the circuit board 102. In the illustrated embodiment, a plurality of fasteners are illustrated for coupling the features to each other. However, it is to be understood that the features may be coupled according to any of the means of coupling the features described throughout this disclosure.

The wireless signal isolation assembly 100 may further include a first group of connectors 702 and a second group of connectors 704. The first group of connectors 702 may include one or more connectors and the second group of connectors 704 may include one or more connectors. The connectors may include filtered connectors to filter wireless interference from the signals. In some embodiments, the connectors may be audio connectors with filters (such as RF filters).

The outer fence 104 may have a group of apertures 706 formed in the outer fence 104. The group of apertures 706 may include one or more apertures, where the amount of apertures in the group of apertures 706 may be the same amount as the connectors within the first group of connectors 702. Each connector of the first group of connectors 702 may be mounted within a corresponding aperture within the group of apertures 706. When mounted within the group of apertures 706, each of the connectors of the first group of connectors 702 may be coupled to the outer fence 104 and may be grounded to the ground of the device and/or chassis in which the wireless signal isolation assembly 100 is implemented based on the coupling.

The first inner fence 208 may have a group of apertures 708 formed in the first inner fence 208. The group of apertures 708 may include one or more apertures, where the amount of apertures in the group of apertures 708 may be the same amount as the connectors within the second group of connectors 704. Each connector of the second group of connectors 704 may be mounted within a corresponding aperture within the group of apertures 708. When mounted within the group of apertures 708, each of the connectors of the second group of connectors 704 may be coupled to the first inner fence 208 and may be grounded to the ground of the device and/or chassis in which the wireless signal isolation assembly 100 is implemented based on the coupling.

The first group of connectors 702 and the second group of connectors 704 may be utilized for providing transmission of signals through the outer shield enclosure 101 (FIG. 1) and the first inner shield enclosure 204 (FIG. 2), respectively. For example, cables may be coupled to a device under test and the first group of connectors 702 to provide for transmission of signals from the device under test and through the outer shield enclosure 101 (described further in relation to FIG. 10). Further, cables may be coupled to the first group of connectors 702 and the second group of connectors 704 to provide for transmission of the signals into the first inner shield enclosure 204.

Figure 8:
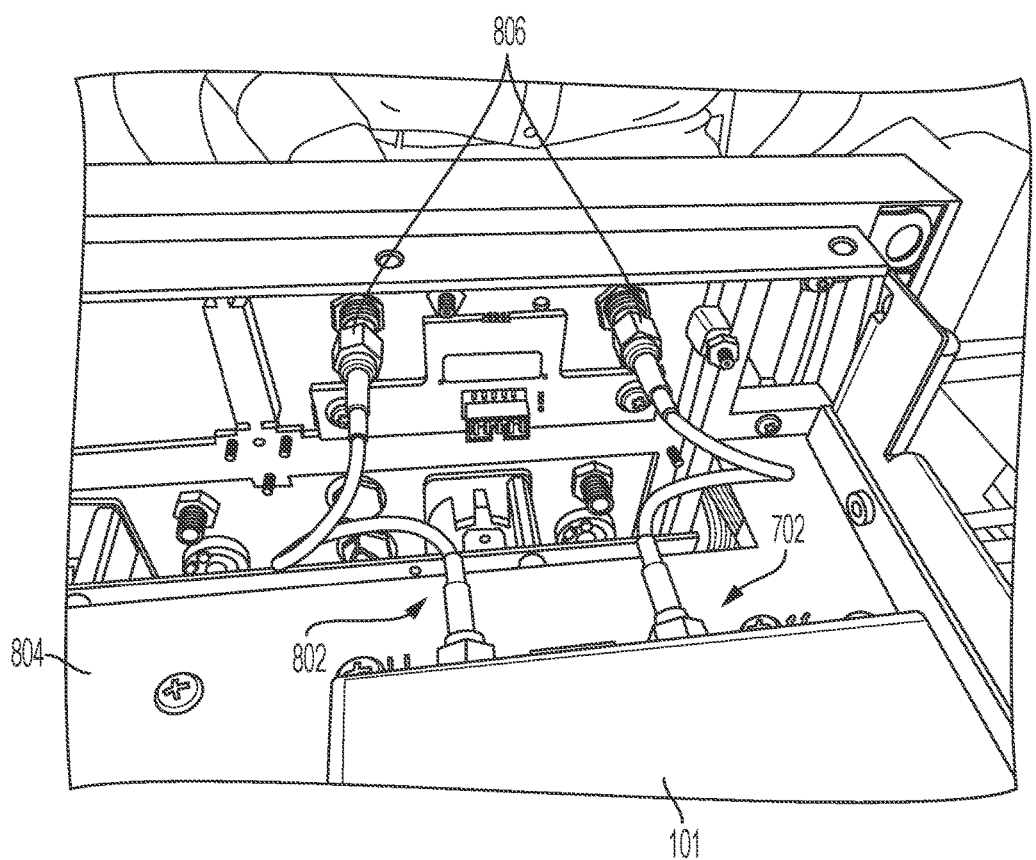
FIG. 8 illustrates example cables coupled to the first group of connectors of FIG. 7, according to various embodiments.

FIG. 8 illustrates example cables 802 coupled to the first group of connectors 702 of FIG. 7, according to various embodiments. In particular, the cables 802 may couple connections 806 of a chassis 804 (such as the chassis 602 (FIG. 6) to the first group of connectors 702. The cables 802 may propagate signals between the connections 806 and the components within outer shield enclosure 101 via the first group of connectors 702. In some embodiments, the cables 802 may be shielded cables that shield against interference from wireless signals.

Figure 9:
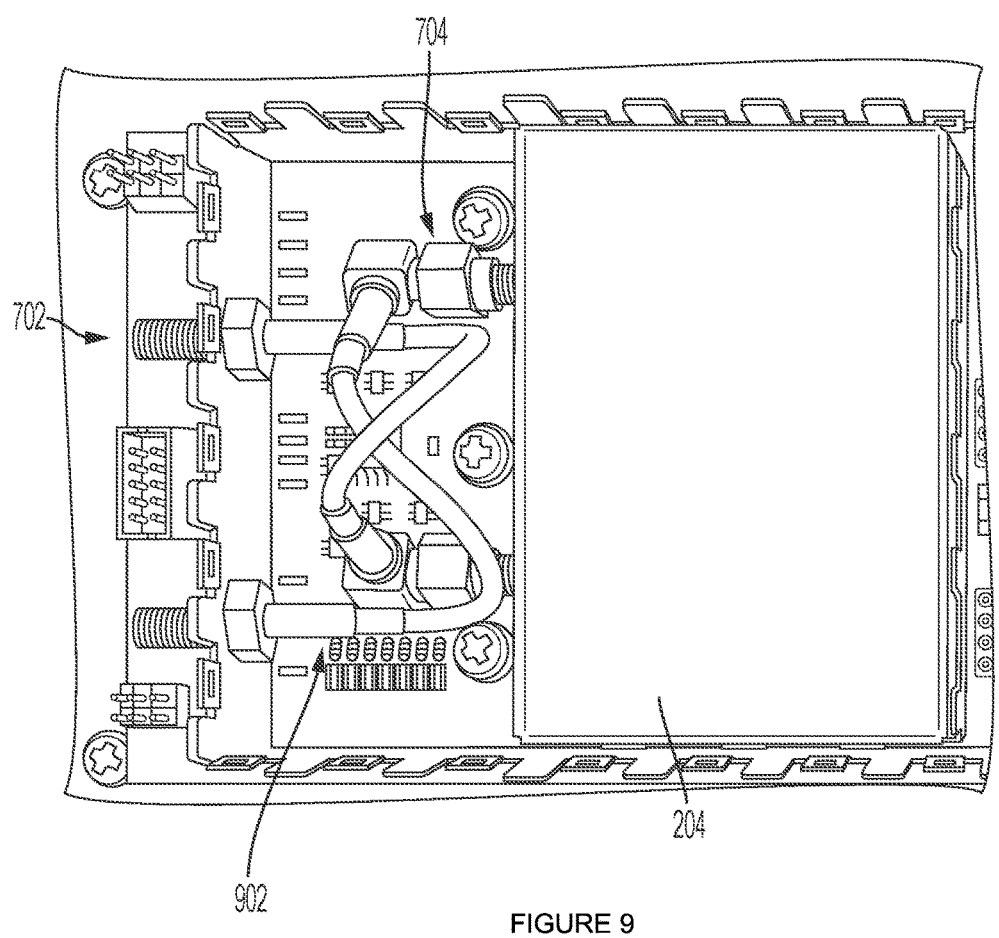
FIG. 9 illustrates example cables coupled to the second group of connectors of FIG. 7, according to various embodiments.

FIG. 9 illustrates example cables 902 coupled to the second group of connectors 704 of FIG. 7, according to various embodiments. In particular, the cables 902 couple the first group of connectors 702 to the second group of connectors 704. The cables 902 may propagate signals between the first group of connectors 702 and the components within the first inner shield enclosure 204 via the second group of connectors 704. In some embodiments, the cables 902 may be shielded cables that shield against interference from wireless signals.

Figure 10:
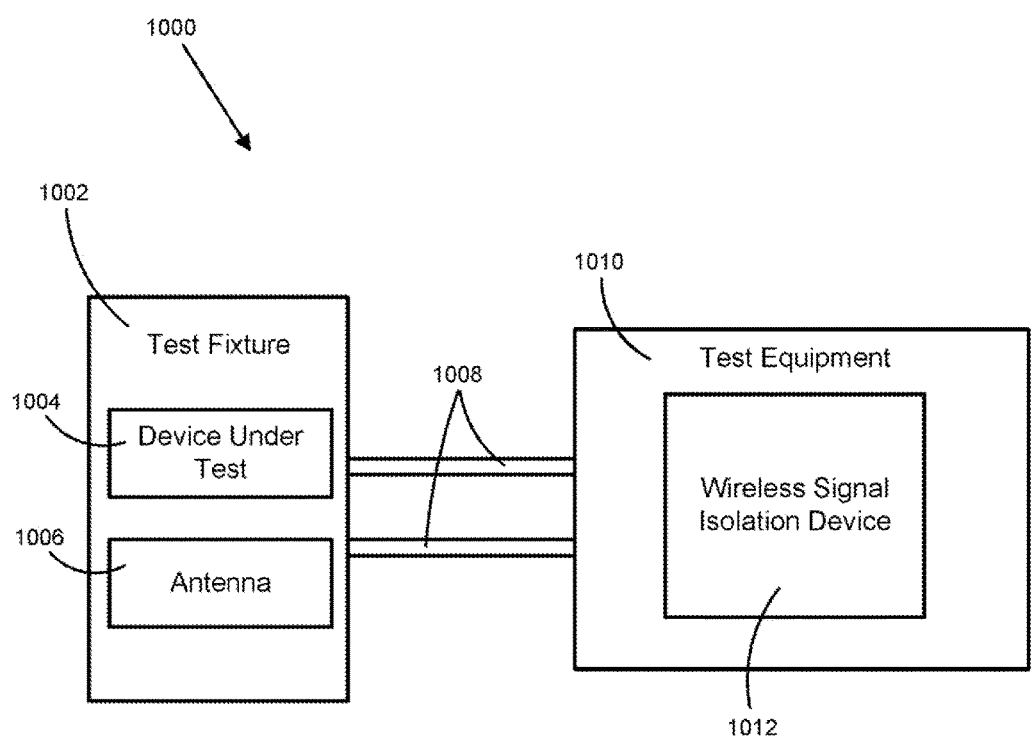
FIG. 10 illustrates an example test setup, according to various embodiments.

FIG. 10 illustrates an example test setup 1000, according to various embodiments. The test setup 1000 may be implemented in research and design test environments, production test environments, or some combination thereof. The test environment may include multiple devices that emit wireless signals, such as RF signals, Wi-Fi signals, mobile communication signals, Bluetooth signals, or some combination thereof.

The test setup 1000 may include a test fixture 1002. In some embodiments, the test fixture 1002 may include a wireless signal isolation chamber in which components of the test fixture 1002 and/or a device under test 1004 may be enclosed. The wireless signal isolation chamber may attenuate wireless signals (such as RF signals, Wi-Fi signals, mobile communication signals, Bluetooth signals, or some combination thereof) that pass, or attempt to pass, through the wireless signal isolation chamber.

The device under test 1004 may be placed within the test fixture 1002. The device under test 1004 may include a device that emits and/or receives one or more wireless signals. For example, the device under test 1004 may be a Bluetooth audio product that may emit and/or receive one or more Bluetooth signals.

The test fixture 1002 may include an antenna 1006. The antenna 1006 may receive signals from and/or transmit signals the device under test 1004. The antenna 1006 may be coupled to one or more cables 1008 that couple the test fixture 1002 to test equipment 1010. The cables 1008 may propagating signals from and/or to the device under test 1004 between the test fixture 1002 and the test equipment 1010.

The test equipment 1010 may include wireless signal isolation device 1012. The wireless signal isolation device 1012 may include one or more of the features of the wireless signal isolation devices described throughout this disclosure. In particular, the wireless signal isolation device 1012 may include the circuit board 102 (FIG. 1) and the wireless signal isolation assembly 100 (FIG. 1). The wireless signal isolation device 1010 may be mounted to the test equipment 1010 via one or more grounding blocks (such as the grounding blocks 502 (FIG. 5)), which may ground one or more of the components of the wireless signal isolation device 1010 to a ground of the test equipment 1010. The wireless signal isolation device 1012 may be utilized by the test equipment 1010 for analysis of the signals received from and/or transmitted to the device under test 1004.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

Example 1 may include a wireless signal isolation assembly including an outer shield enclosure to be mounted to a circuit board, the outer shield enclosure to enclose circuitry of the circuit board that is to be isolated from interference from wireless signals, wherein the outer shield enclosure is to attenuate wireless signals that pass through the outer shield enclosure. The wireless signal isolation assembly may further include a first inner shield enclosure located within the outer shield enclosure and to be mounted to the circuit board, the first inner shield enclosure to enclose first circuitry of the circuit board that is susceptible to interference from wireless signals, wherein the first inner shield enclosure is to attenuate wireless signals that pass through the first inner shield enclosure. The wireless signal isolation assembly may further include a second inner shield enclosure located within the outer shield enclosure and to be mounted to the circuit board, the second inner shield enclosure to enclose second circuitry of the circuit board that is susceptible to interference from wireless signals, wherein the second inner shield enclosure is to attenuate wireless signals that pass through the second inner shield enclosure.

Example 2 may include the wireless signal isolation assembly of example 1 or some other example herein, wherein the outer shield enclosure, the first inner shield enclosure, and the second inner shield enclosure are formed of a material that attenuates wireless signals.

Example 3 may include the wireless signal isolation assembly of example 1 or some other example herein, wherein the outer shield enclosure is formed of tin-plated steel.

Example 4 may include the wireless signal isolation assembly of example 1 or some other example herein, wherein the first inner shield enclosure is formed of tin-plated steel.

Example 5 may include the wireless signal isolation assembly of example 1 or some other example herein, wherein the second inner shield enclosure is formed of a nickel-silver-copper alloy.

Example 6 may include the wireless signal isolation assembly of example 1 or some other example herein, wherein the outer shield enclosure is to attenuate wireless signals by up to 30 decibels.

Example 7 may include the wireless signal isolation assembly of example 1 or some other example herein, wherein the outer shield enclosure is to attenuate wireless signals by between 20 decibels and 30 decibels.

Example 8 may include the wireless signal isolation assembly of example 1 or some other example herein, wherein the first inner shield enclosure is to attenuate wireless signals by up to 30 decibels.

Example 9 may include the wireless signal isolation assembly of example 1 or some other example herein, wherein the first inner shield enclosure is to attenuate wireless signals by between 20 decibels and 30 decibels.

Example 10 may include the wireless signal isolation assembly of example 1 or some other example herein, wherein the second inner shield enclosure is to attenuate wireless signals by up to 30 decibels.

Example 11 may include the wireless signal isolation assembly of example 1 or some other example herein, wherein the second inner shield enclosure is to attenuate wireless signals by between 20 decibels and 30 decibels.

Example 12 may include the wireless signal isolation assembly of example 1 or some other example herein, wherein the outer shield enclosure is grounded.

Example 13 may include the wireless signal isolation assembly of example 1 or some other example herein, wherein the first inner shield enclosure is grounded.

Example 14 may include the wireless signal isolation assembly of example 1 or some other example herein, wherein the second inner shield enclosure is grounded.

Example 15 may include the wireless signal isolation assembly of example 1 or some other example herein, wherein the outer shield enclosure includes an outer fence and an outer cover coupled to the outer fence, wherein the outer fence is coupled to the circuit board and encircles the circuitry of the circuit board that is to be isolated from interference from wireless signals, and wherein the outer cover covers an aperture formed by a top edge of the outer fence, the top edge located opposite to the circuit board, and encloses the circuitry of the circuit board that is to be isolated from interference from wireless signals.

Example 16 may include the wireless signal isolation assembly of example 15 or some other example herein, wherein the outer fence includes a series of offset extensions formed at a top edge of the outer fence, and wherein the outer cover couples to the outer fence via friction with the series of offset extensions.

Example 17 may include the wireless signal isolation assembly of example 1 or some other example herein, wherein the first inner shield enclosure includes an inner fence and an inner cover coupled to the inner fence, wherein the inner fence is coupled to the circuit board and encircles the first circuitry of the circuit board that is susceptible to interference from wireless signals, and wherein the inner cover covers an aperture formed by a top edge of the inner fence, the top edge located opposite to the circuit board, and encloses the first circuitry of the circuit board that is susceptible interference from wireless signals.

Example 18 may include the wireless signal isolation assembly of example 17 or some other example herein, wherein the inner fence includes a series of offset extensions formed at a top edge of the inner fence, and wherein the inner cover couples to the inner fence via friction with the series of offset extensions.

Example 19 may include the wireless signal isolation assembly of example 1 or some other example herein, wherein the second inner shield enclosure includes an inner fence and an inner cover coupled to the inner fence, wherein the inner fence is coupled to the circuit board and encircles the second circuitry of the circuit board that is susceptible to interference from wireless signals, and wherein the inner cover covers an aperture formed by a top edge of the inner fence, the top edge located opposite to the circuit board, and encloses the second circuitry of the circuit board that is susceptible interference from wireless signals.

Example 20 may include the wireless signal isolation assembly of example 19 or some other example herein, wherein the inner fence includes a series of offset extensions formed at a top edge of the inner fence, and wherein the inner cover couples to the inner fence via friction with the series of offset extensions.

Example 21 may include a wireless signal isolation device including a circuit board and the wireless signal isolation assembly of any of the examples 1-20, wherein the circuit board recited in examples 1-20 is the circuit board included in example 21, and wherein the wireless signal isolation assembly is mounted to the circuit board.

Example 22 may include the wireless signal isolation device of example 21 or some other example herein, wherein the circuit board includes a layer or a region formed of a material that attenuates wireless signals, and wherein the layer or the region extends for an area of the circuit board encircled by the outer fence of the wireless signal isolation assembly.

Example 23 may include the wireless signal isolation device of example 22 or some other example herein, wherein the layer or the region is formed of copper.

Example 24 may include the wireless signal isolation device of example 22 or some other example herein, wherein the layer or the region attenuates wireless signals by up to 30 decibels.

Example 25 may include the wireless signal isolation device of example 22 or some other example herein, wherein the layer or the region attenuates wireless signals by between 20 decibels and 30 decibels.

Example 26 may include the wireless signal isolation device of example 22 or some other example herein, wherein the layer or the region is the first layer or the first region, wherein the circuit board includes a second layer or a second region formed of the material that attenuates wireless signals, and wherein the second layer or the second region extends for the area of the circuit board encircled by the outer fence of the wireless signal isolation assembly.

Example 27 may include the wireless signal isolation device of example 21 or some other example herein, wherein the circuit board includes one or more grounding strips to ground the outer enclosure, the first inner enclosure, and the second inner enclosure of the wireless signal isolation assembly, and wherein the one or more grounding strips are located on an opposite side of the circuit board from the wireless signal isolation assembly.

Example 28 may include the wireless signal isolation device of example 27 or some other example herein, wherein the circuit board includes a layer or a region formed of a material that attenuates wireless signals, wherein the layer or the region extends for an area of the circuit board encircled by the outer fence of the wireless signal isolation assembly, and wherein the layer or the region is grounded via the grounding strips.

Example 29 may include test equipment to analyze a device under test, wherein the test equipment includes a chassis, the wireless signal isolation device of any of examples 21-28, and one or more grounding blocks, the one or more grounding blocks coupling the wireless signal isolation device to the chassis, wherein the one or more grounding blocks ground the wireless signal isolation device to the chassis.

Example 30 may include the wireless signal isolation device of example 29 or some other example herein, wherein the one or more grounding blocks couple to the circuit board of the wireless signal isolation device at the grounding strips of the wireless signal isolation device, and wherein the grounding blocks ground the grounding strips of the wireless signal isolation device.

Example 31 may include the wireless signal isolation device of example 30 or some other example herein, wherein each of the one or more grounding blocks couple to the circuit board at a corresponding one of the grounding strips.

What is claimed is:

1. A wireless signal isolation assembly to be mounted to a circuit board, the wireless signal isolation assembly comprising:
    an outer shield enclosure to be mounted to the circuit board, the outer shield enclosure to enclose circuitry of the circuit board that is to be isolated from interference from wireless signals, wherein the outer shield enclosure is to attenuate wireless signals that pass through the outer shield enclosure, wherein the outer shield enclosure includes an outer fence and an outer cover coupled to the outer fence, wherein the outer fence includes a series of offset extensions formed at a top edge of the outer fence, and wherein the outer cover couples to the outer fence via friction with the series of offset extensions;
    a first inner shield enclosure to be located within the outer shield enclosure and to be mounted to the circuit board, the first inner shield enclosure to enclose a first portion of the circuitry of the circuit board that is susceptible to interference from wireless signals, wherein the first inner shield enclosure is to attenuate wireless signals that pass through the first inner shield enclosure; and
    a second inner shield enclosure to be located within the outer shield enclosure and to be mounted to the circuit board, the second inner shield enclosure to enclose a second portion of the circuitry of the circuit board that is susceptible to interference from wireless signals, wherein the second inner shield enclosure is to attenuate wireless signals that pass through the second inner shield enclosure.

2. The wireless signal isolation assembly of claim 1, wherein the outer shield enclosure, the first inner shield enclosure, and the second inner shield enclosure are formed of a material that attenuates wireless signals.

3. The wireless signal isolation assembly of claim 1, wherein the outer shield enclosure or the first inner shield enclosure is formed of tin-plated steel.

4. The wireless signal isolation assembly of claim 1, wherein the second inner shield enclosure is formed of a nickel-silver-copper alloy.

5. The wireless signal isolation assembly of claim 1, wherein the outer shield enclosure, the first inner shield enclosure, and the second inner shield enclosure are to attenuate wireless signals by up to 30 decibels.

6. The wireless signal isolation assembly of claim 5, wherein the outer shield enclosure, the first inner shield enclosure, and the second inner shield enclosure are to attenuate wireless signals by between 20 decibels and 30 decibels.

7. The wireless signal isolation assembly of claim 1, wherein the outer fence is coupled to the circuit board and encircles the circuitry of the circuit board that is to be isolated from interference from wireless signals, wherein the outer cover covers an aperture formed by a top edge of the outer fence and encloses the circuitry of the circuit board that is to be isolated from interference from wireless signals, and wherein the top edge is located opposite to the circuit board.

8. The wireless signal isolation assembly of claim 1, wherein the first inner shield enclosure includes an inner fence and an inner cover coupled to the inner fence, wherein the inner fence is coupled to the circuit board and encircles the first portion of the circuitry of the circuit board that is susceptible to interference from wireless signals, and wherein the inner cover covers an aperture formed by a top edge of the inner fence and encloses the first circuitry of the circuit board that is susceptible interference from wireless signals.

9. The wireless signal isolation assembly of claim 1, wherein the second inner shield enclosure includes an inner fence and an inner cover coupled to the inner fence, wherein the inner fence is coupled to the circuit board and encircles the second portion of the circuitry of the circuit board that is susceptible to interference from wireless signals, and wherein the inner cover covers an aperture formed by a top edge of the inner fence and encloses the second circuitry of the circuit board that is susceptible interference from wireless signals.

10. A wireless signal isolation device, comprising:
a circuit board;
an outer shield enclosure mounted to the circuit board, the outer shield enclosure to enclose circuitry of the circuit board that is to be isolated from interference from wireless signals, wherein the outer shield enclosure is to attenuate wireless signals that pass through the outer shield enclosure; and
an inner shield enclosure located within the outer shield enclosure and mounted to the circuit board, the inner shield enclosure to enclose a portion of the circuitry of the circuit board that is susceptible to interference from wireless signals, wherein the inner shield enclosure is to attenuate wireless signals that pass through the inner shield enclosure, wherein the inner shield enclosure includes an inner fence and an inner cover coupled to the inner fence, wherein the inner fence is coupled to the circuit board and fully encircles the portion of the circuitry of the circuit board that is susceptible to interference from wireless signals, and wherein the inner cover covers an aperture formed by a top edge of the inner fence and encloses the circuitry of the circuit board that is susceptible interference from wireless signals.

11. The wireless signal isolation device of claim 10, wherein the inner shield enclosure is a first inner shield enclosure, wherein the portion of the circuitry of the circuit board is a first portion of the circuitry of the circuit board, and wherein the wireless isolation device further comprises:
a second inner shield enclosure located within the outer shield enclosure and mounted to the circuit board, the second inner shield enclosure to enclose a second portion of the circuitry of the circuit board that is susceptible to interference from wireless signals, wherein the second inner shield enclosure is to attenuate wireless signals that pass through the second inner shield enclosure.

12. The wireless signal isolation device of claim 11, wherein the outer shield enclosure or the first inner shield enclosure is formed of tin-plated steel.

13. The wireless signal isolation device of claim 11, wherein the second inner shield enclosure is formed of a nickel-silver-copper alloy.

14. The wireless signal isolation device of claim 11, wherein the outer shield enclosure, the first inner shield enclosure, or the second inner shield enclosure is grounded.

15. The wireless signal isolation device of claim 14, wherein the circuit board includes one or more grounding strips located on an opposite side of the circuit board from the outer shield enclosure, the first inner shield enclosure, and the second inner shield enclosure, wherein the one or more grounding strips are to be coupled to a ground of a system in which the wireless signal isolation device is to be mounted, and wherein the one or more grounding strips cause the at least one of the outer shield enclosure, the first inner shield enclosure, or the second inner shield enclosure to be grounded when the one or more grounding strips are coupled to the ground of the system.

16. The wireless signal isolation device of claim 15, further comprising one or more grounding blocks coupled to the one or more grounding strips, wherein the one or more grounding blocks are to couple the one or more grounding strips to the ground of the system.

17. The wireless signal isolation device of claim 10, wherein the outer shield enclosure includes an outer fence and an outer cover coupled to the outer fence, wherein the outer fence is coupled to the circuit board and encircles the circuitry of the circuit board that is to be isolated from interference from wireless signals, and wherein the outer cover covers a second aperture formed by a top edge of the outer fence, the top edge located opposite to the circuit board, and encloses the circuitry of the circuit board that is to be isolated from interference from wireless signals.

18. The wireless signal isolation device of claim 10, wherein the circuit board includes a layer or a region formed of a material that attenuates wireless signals, and wherein the layer or the region extends to an area of the circuit board enclosed by the outer shield enclosure.

19. The wireless signal isolation device of claim 18, wherein the circuit board includes one or more grounding strips coupled to the layer or the region, wherein the one or more grounding strips are to be coupled to a ground of a system in which the wireless signal isolation device is to be mounted, and wherein the one or more grounding strips are to couple the layer or the region to the ground of the system.

* * * * *